(12) United States Patent
Lammert

(10) Patent No.: US 6,406,965 B1
(45) Date of Patent: Jun. 18, 2002

(54) METHOD OF FABRICATING HBT DEVICES

(75) Inventor: Michael D. Lammert, Manhattan Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/837,966

(22) Filed: Apr. 19, 2001

(51) Int. Cl.[7] ............................................. H01L 21/331
(52) U.S. Cl. ....................... 438/312; 438/314; 438/319
(58) Field of Search ................................. 438/312, 314, 438/319, 170, 172, 313, 320, 328

(56) References Cited

U.S. PATENT DOCUMENTS

| | | | |
|---|---|---|---|
| 5,024,958 A | * 6/1991 | Awano | 438/319 |
| 5,268,315 A | * 12/1993 | Prasad et al. | 438/319 |
| 5,296,389 A | * 3/1994 | Shimawaki | 438/319 |
| 5,486,483 A | 1/1996 | Lammert | |
| 5,804,487 A | 9/1998 | Lammert | 438/319 |

* cited by examiner

*Primary Examiner*—Tuan H. Nguyen
(74) *Attorney, Agent, or Firm*—Antonelli, Terry, Stout & Kraus, LLP

(57) ABSTRACT

A method of fabricating an HBT transistor with extremely high speed and low operating current. The transistor has a small base area and a small emitter area with most of the emitter area contacted with metal, most of the base area, outside of the emitter, contacted with metal and a collector ohmic metal placed close to the device emitter and the base ohmic metal. To achieve this, the method includes partially undercutting the base ohmic metal along all external edges to reduce the device's parasitic base-collector capacitance. In order to provide metal step coverage, the undercut of the base ohmic metal can be covered with a sloped edge polymer. In addition, a Schottky diode can be fabricated within the process steps used to form the HBT transistor without additional process steps being needed to build the Schottky diode.

22 Claims, 7 Drawing Sheets

METHOD OF FABRICATING HBT DEVICES

BACKGROUND OF THE INVENTION

1. Field of the Invention

The present invention relates to a method for fabricating integrated circuits, and more particularly, to a method of fabricating heterojunction bipolar transistors (HBTs) having extremely high speed at very low currents.

2. Description of the Prior Art

U.S. Pat. 5,486,483 and 5,804,487, issued to the inventor, teach methods for forming semiconductor devices such as HBTs permitting achievement of highly controllable spacing between an emitter mesa and base ohmic contact metal of the HBT. This spacing is an important factor in providing good performance of the device. It is now desirable to further develop such HBTs to operate at the highest possible speed while achieving a small individual device current. This will permit a large number of high-speed devices to be formed on a single chip while still maintaining a reasonable chip power level.

SUMMARY OF THE INVENTION

It is an object of the present invention to provide a method of fabricating an HBT having extremely high speed at the lowest possible current.

Briefly, the present invention provides a method for forming very high speed HBTs with low power consumption by providing an arrangement for achieving extremely small emitter area and extremely small base area, with a large portion of both the emitter area and the base area being contacted with metal. In conjunction with this, the collector metal contact can be closely spaced to the emitter to achieve a low parasitic collector resistance. To achieve this in accordance with one embodiment of the invention, a collector layer, a base layer and an emitter layer are formed in a stacked arrangement on a substrate. A layer of material is then deposited on the emitter layer, a first photoresist is formed over a portion of the material, and the layer of material and the emitter layer are etched using the first photoresist as a mask to form an emitter mesa on the base layer. At this point, the material remains on top of the emitter mesa and the first photoresist remains on top of the material. Next, a second photoresist is deposited on the base layer. The second photoresist is patterned and developed on the base layer to expose a portion of the base layer surrounding the emitter mesa. A base ohmic metal is then formed on the first and second photoresists and the exposed portion of the base layer. The first and second photoresists, with the base ohmic material thereon, are lifted off, leaving the base ohmic material on the base layer. By virtue of the preceding steps, the base ohmic material is uniformly spaced relative to the emitter mesa. Next, the emitter mesa and a portion of the base ohmic metal is covered with a third photoresist. The base layer is then etched to undercut the base ohmic metal, thereby reducing the size of the base layer and, correspondingly, significantly reducing the base-collector parasitic capacitance.

DETAILED DESCRIPTION

Embodiments of the invention will be discussed with reference to FIGS. 1 to 25.

The primary factor which controls the speed of an HBT transistor is the growth of the emitter, base, and collector layers of the device. However, once the layers have been grown, it is the method of etching the emitter, base, and collector and the method of making metal contacts to those layers that determine the device's operating speed as a function of current. From his studies, the inventor has determined that key attributes that are needed in fabricating a HBT transistor of a given layer growth to achieve high frequency operation at the lowest possible current include:

small emitter area, which results in a smaller emitter-base parasitic capacitance and permits operation at a high current density at a low operating current, a large portion of the emitter area contacted with metal to achieve a low parasitic emitter resistance, a minimum base area, which results in the smallest possible base-collector parasitic capacitance, a large portion of the base area contacted with metal for a low parasitic base resistance, and a collector metal contact closely spaced to the emitter for a low parasitic collector resistance.

The present invention provides a process that can built an HBT device with the above attributes to permit the fabrication of complex HBT integrated circuits that operate at very high speeds and low currents.

This invention consists of a method of fabricating a HBT transistor with a small emitter area, a small base area, most of the emitter area contacted with metal, most of the base area outside of the emitter contacted with metal, and a collector ohmic metal placed close to the device emitter and base ohmic metal. The invention also includes a method of partially undercutting the base ohmic metal along all external edges of the metal to further reduce the device's parasitic base-collector capacitance, and covering the undercut base ohmic metal with a sloped edge polymer to provide metal step coverage. A Schottky diode can be fabricated within the process steps required to form the HBT transistor; therefore, no additional process steps are needed to build the Schottky diode. The concepts of this invention, the details of which are described below, can be applied to GaAs, InP, and most, if not all, HBT semiconductor materials.

Figure 1:
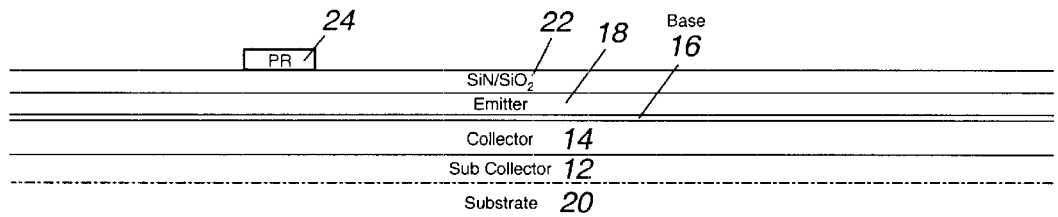
FIGS. 1 to 21 are sectional views of successive steps for simultaneously forming an HBT and a Schottky diode in accordance with the present invention.

Referring to FIG. 1, the layers of a HBT device 10, including a heavily doped sub-collector 12, a lightly doped collector 14, a heavily doped base 16, and a lightly doped emitter 18, each layer of which may be comprised of several sub-layers, are grown by one of several conventional techniques, such as MBE or MOCVD on a substrate 20. A material 22, such as silicon nitride (SiN) or silicon dioxide (SiO$_2$), which has the capability of being etched with nearly a 100% selectivity to both semiconductor layers and organic polymer materials, is deposited onto the substrate over the emitter layer 18 at a thickness of about 2000 Å to 3000 Å. A photoresist 24, which can be baked at a relatively high temperature of 130° C. to 160° C. without significant flow, is coated over the SiN (SiO$_2$) layer 22. Then the photoresist layer 24 is patterned using conventional photolithography techniques, as shown in the cross section of the HBT device in FIG. 1, to be located. over an area where an emitter mesa will be formed. The patterned resist 24 is baked at about 130° C. to 160° C. after patterning so that the resist will not dissolve when the next photoresist layer is coated over this patterned layer. If desired, a Schottky device 26 can be formed at the same time as the HBT device 10, as will be discussed later.

Figure 2:
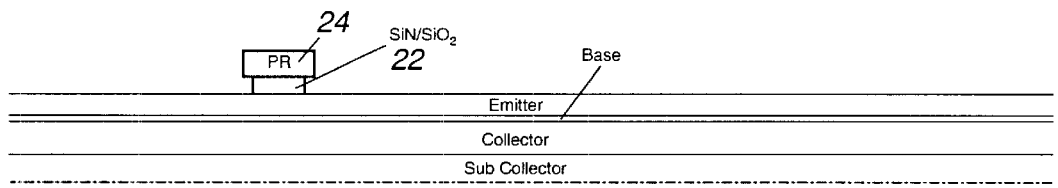

The SiN (or SiO$_2$) layer 22 is etched to within about 100 Å to 400 Å of the emitter surface using an anisotropic dry etch, then the etch is completed to the emitter surface with an isotropic etch, such as a wet etch in BOE (buffered oxide etch), that etches about 500 Å to 800 Å of SiN (or SiO$_2$) layer 22 that undercuts the photoresist 24 by this amount, as shown in FIG. 2. Depending on the type of anisotropic etch used, it may be necessary to use an isotropic O$_2$ de-scum to remove a sidewall polymer on the SiN (or SiO$_2$) 22 prior to the isotropic etch.

Figure 3:
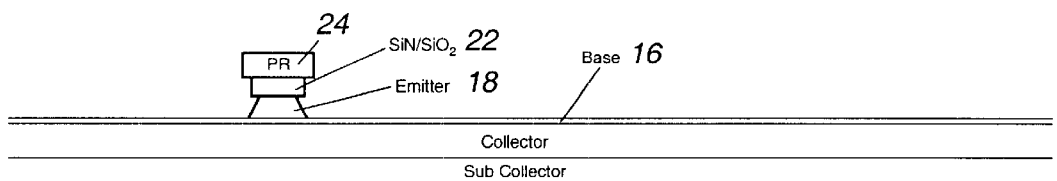
Figure 4:
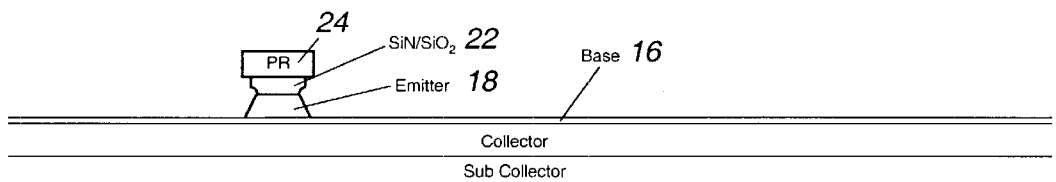

The semiconductor material forming the emitter layer 18 is etched using an isotropic or a partially anisotropic dry etch, or a wet etch, or a combination of the two to the appropriate depth for making contact to the base layer 16, as shown in FIG. 3. The SiN (or SiO$_2$) layer 22 is etched laterally by 500 Å to 800 Å with a wet BOE etch, as shown in FIG. 4 to reduce the SiN (or SiO$_2$) layer 22 which extends beyond the emitter layer 18. (For final emitter widths of $\leq 0.3$ μm it may be desirable to delete this step).

Figure 5:
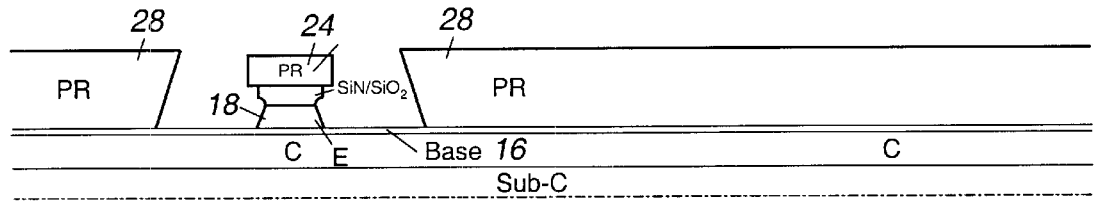
Figure 6:
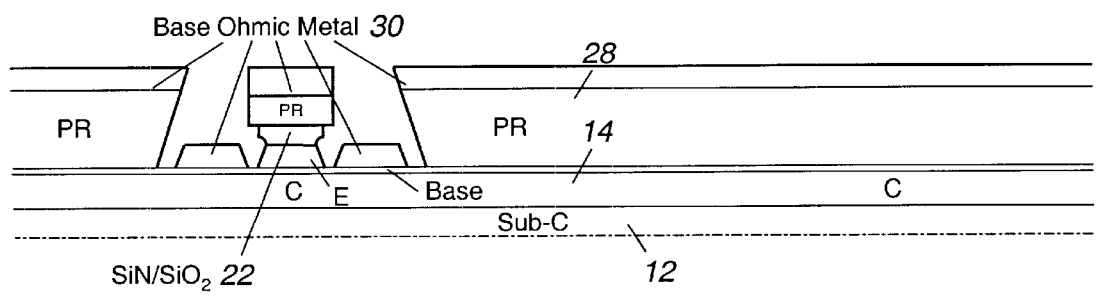
Figure 7:
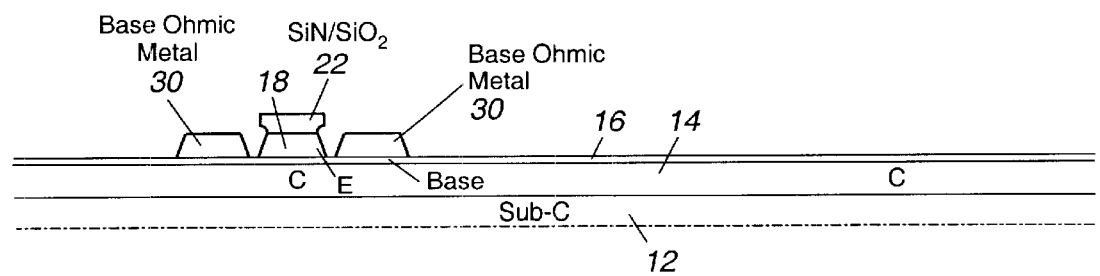

A base ohmic resist layer 28 is coated on the wafer and patterned with a re-entrant profile for metal lift off using any of several conventional processes, such as NH$_3$ image reversal on a positive resist, a chlorobenzene treated positive resist, or a negative i-line resist, as diagramed in FIG. 5. A base ohmic metal 30 is then deposited onto the wafer covering the lift-off resist 28, the resist 24 over the emitter 18, and the base surface area next to the emitter at a thickness somewhat less or equal to the height of the emitter region, as shown in FIG. 6. The emitter resist 24 and the base ohmic resist 28 is lifted off leaving only the base ohmic metal 30 and the SiN (or SiO$_2$) layer 22 above the emitter region 18, as shown in FIG. 7.

Figure 8:
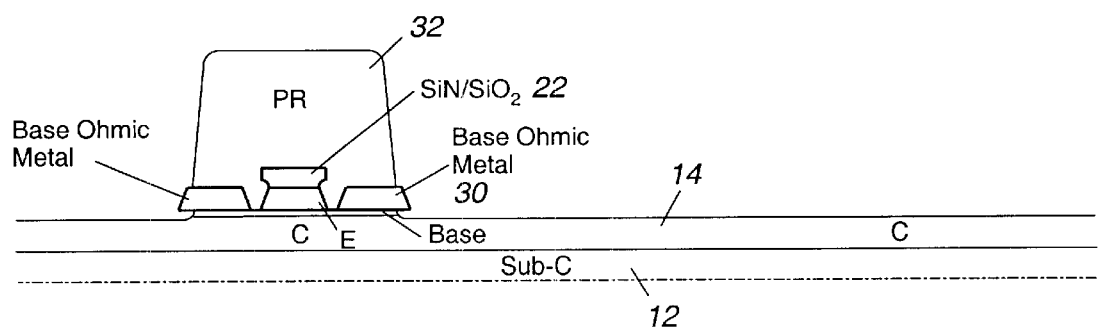

Next, a base mesa photoresist pattern 32 is used to cover the emitter region 18 of the device, then the base region 16 is etched by a wet etch, an isotropic dry etch, or a partially anisotropic dry etch to a depth somewhat past the base region, typically to a depth of 500 Å to 3000 Å. If a Schottky diode is also being fabricated, the depth of this etch can be to the surface of the Schottky diode surface. Although an anisotropic dry etch can be used for this etch, an isotropic or mostly isotropic etch is preferably used to undercut the base ohmic metal 30, reducing the base-collector parasitic capacitance. If a dry etch is used to etch the base layer 16, it can be followed by a brief wet etch to eliminate surface damage. The HBT device 10 and Schottky diode 26 cross-section after this process step is shown in FIG. 8.

Figure 9:
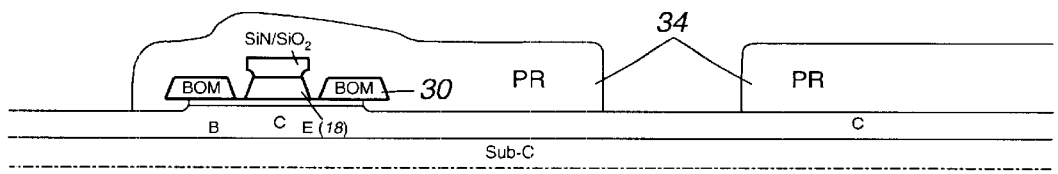
Figure 10:
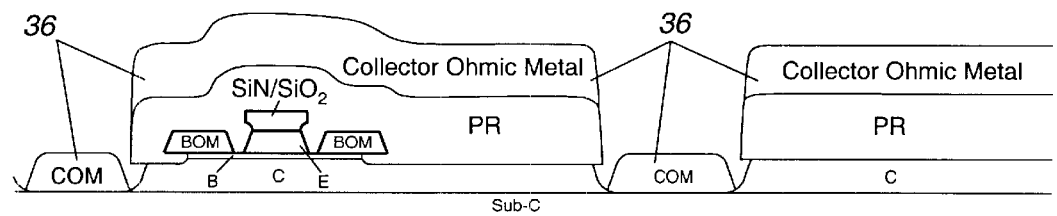
Figure 11:
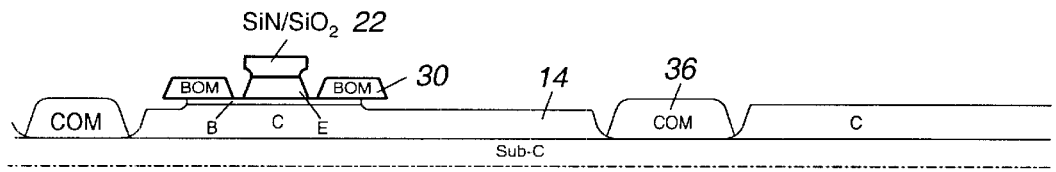

After stripping the base mesa photoresist 32 using any conventional means, a collector ohmic resist 34 is patterned to make contact to the sub-collector 12 of both the HBT device 10 and the Schottky diode 26, as shown in device cross sections in FIG. 9. The collector region 14 is etched with an isotropic wet etch, an isotropic dry etch or a partially isotropic dry etch to the depth of the sub-collector surface 12, then a collector ohmic metal 36 is deposited into the etched region at a thickness about equal to the depth of the etch or slightly greater, as shown in FIG. 10. The resist 34 and the collector ohmic metal 36 over it are lifted off using any conventional resist lift-off procedure, as diagramed in FIG. 11. Then the collector ohmic metal 36 and the base ohmic metal 30 are alloyed using a short furnace anneal or a rapid thermal anneal (RTA) at about 350° C. to 400° C.

Figure 12:
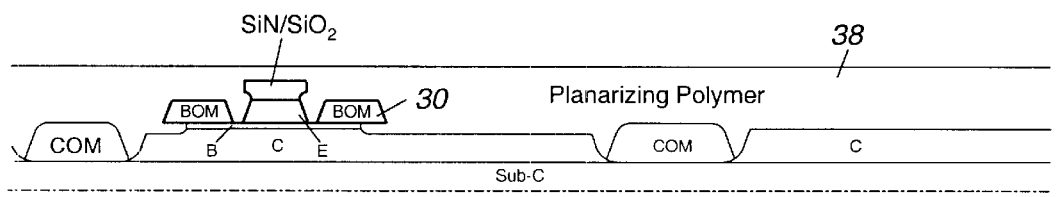
Figure 13:
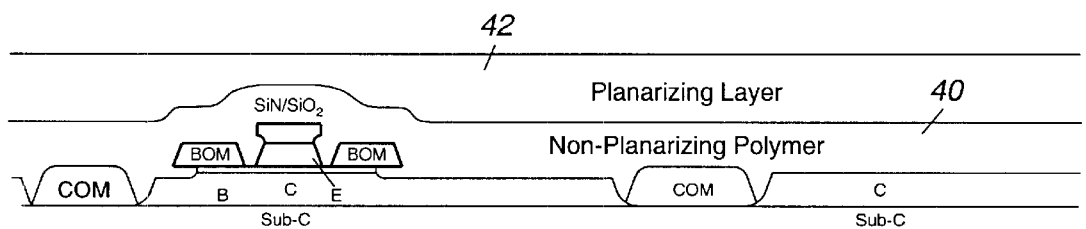

Next, the wafer is covered with a polymer 38 at a thickness of about 500 Å to 1000 Å thicker than the distance from the top of the SiN (or SiO$_2$) layer 22 to the bottom of the etched base mesa region (or the surface of the Schottky diode). If the polymer 38 is a planarizing material, such as benzocylobutene (BCB), the polymer is cured and flowed flat (as shown in FIG. 12). As shown in FIG. 13, if the polymer directly covering the emitter mesa 18 and the collector layer 14 is a non-planarizing polymer 40, such as polyimide, it is first cured, then a second planarizing layer 42 is coated over the non-planarizing polymer 40. The planarizing layer 42 is cured to flow flat over the non-planarizing polymer 40. A diagram showing the device cross sections with the single planarizing polymer layer 38 is shown in FIG. 12. A diagram showing similar cross sections for the combination of a non-planarizing polymer 40 covered with a planarizing layer 42 is shown in FIG. 13.

Figure 14:
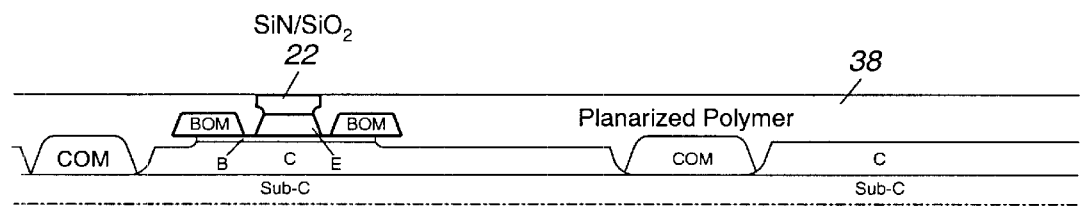

The planarized polymer 38 of FIG. 12 or the polymer 40 plus the planarizing layer 42 of FIG. 13 is etched with a dry etch using a gas such as O$_2$ or SF$_6$, CF$_4$, CHF$_3$, or NF$_3$ with O$_2$ until the surface of the SiN (or SiO$_2$) layer 22 over the emitter 18 is exposed with about 100 Å to 500 Å of the SiN (or SiO$_2$) layer 22 protruding above the polymer 38, as indicated in the device cross sections in FIG. 14. If the two layer arrangement of FIG. 13 is used, the SiN (or SiO$_2$) layer 22 will protrude above the polymer 40 which has been planarized during the etch of the planarizing layer 42. For purposes of simplification, the following discussion will assume a single layer of planarizing polymer 38 is being used.

Figure 15:
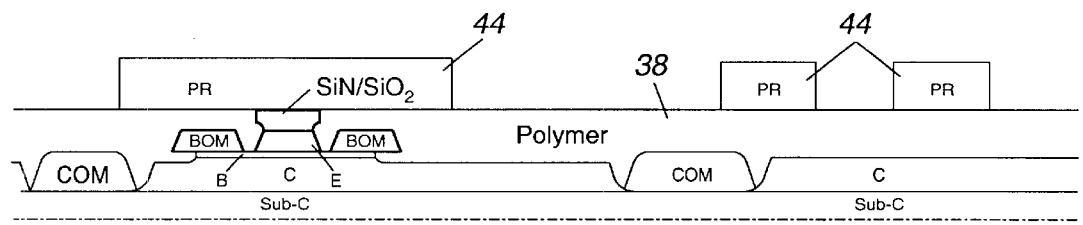
Figure 16:
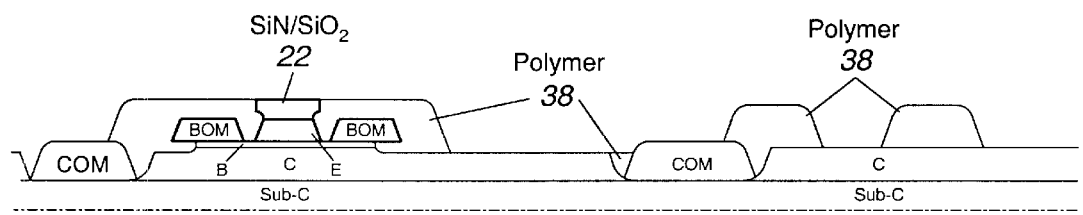

Next, a photoresist layer 44 is coated over the polymer layer 38 and patterned to cover the HBT 10 and Schottky device 26, except for regions to make contact to the collector ohmic metal 36 of the HBT device and the cathode of the Schottky diode, and for a hole in the polymer 38 to make contact to the base ohmic metal 30 and the anode of the Schottky device. This step is shown in FIG. 15, except this cross section does not show the contact to the base ohmic metal 30 for purposes of drawing simplification.

The polymer 38 is etched, using the photoresist 44, with a dry etch using SF$_6$, CHF$_3$, CHF$_4$, NF$_3$ or equivalent gas with O$_2$ gas ratios set so that about a 2:1 to 5:1 partially anisotropic etch is achieved. A brief wet etch that removes about 50 Å to 300 Å of material from the Schottky diode anode (and other areas not protected by the polymer 38 and resist 44) can be used to eliminate surface damage from the dry etch prior to stripping the photoresist 44 by conventional means. The device cross sections after this process step are shown in the sketches in FIG. 16.

Figure 17:
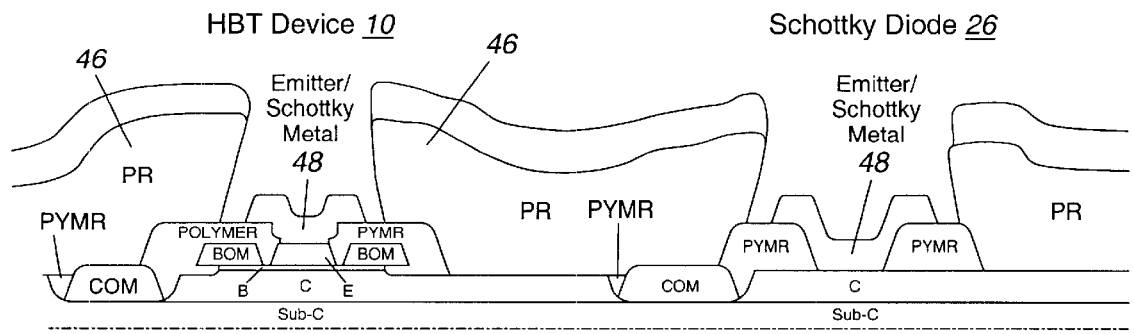

Following this, the SiN (or SiO$_2$) layer 22 over the emitter 18 is removed with a wet etch in buffered oxide etch. The wafer is coated with a photoresist 46, then a lift-off resist pattern is formed over the emitter 18 of the HBT device 10 and the anode of the Schottky diode 26 using any of several conventional means such as i-line negative resist, a NH$_3$ image reversal of a positive resist, or a chlorobenzene treated positive resist. A metal 48, which makes a good ohmic contact to the emitter of the HBT device 10 and a Schottky barrier contact to the lightly doped collector region of the Schottky diode 26, is evaporated onto the wafer, as illustrated in FIG. 17.

Figure 18:
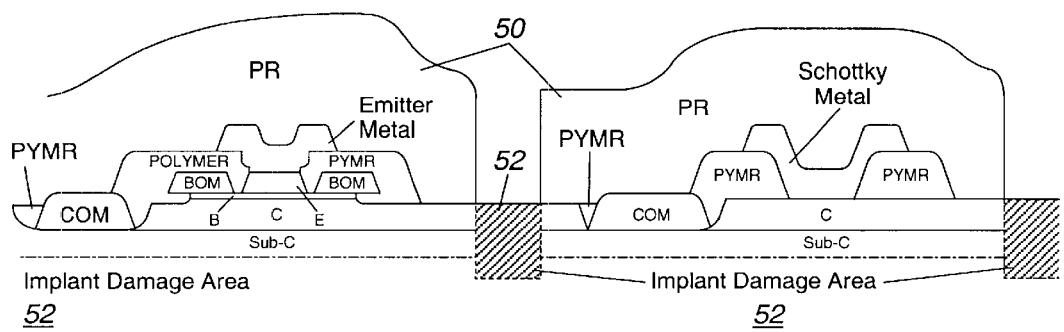
Figure 19:
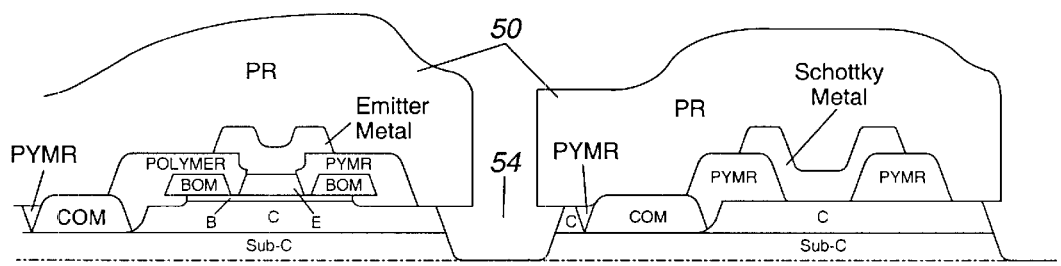

Referring to FIG. 18, the resist 46 and the metal 48 on top of it are lifted off by any conventional lift-off process. A new photoresist layer 50 is then coated and patterned over the HBT transistor 10 and Schottky diode 26 for the purpose of forming isolating regions for the devices. The HBT 10 and Schottky diode 26 can be isolated by using an implanted species, such as H, B, or 0, to create implant damage areas 52 in the remaining lightly doped collector region 14 and the more heavily doped subcollector 12 using multiple doses and energies of implanted species as necessary to create uniform damage throughout these regions, as indicated in device cross sections shown in FIG. 18. For semiconductor types that cannot be isolated by implantation, a wet etch or a slightly isotropic dry etch can be used to etch through the collector 14 and sub-collector region 12 to the substrate region 20, as shown in device cross sections in FIG. 19, to create isolating trenches 54.

Figure 20:
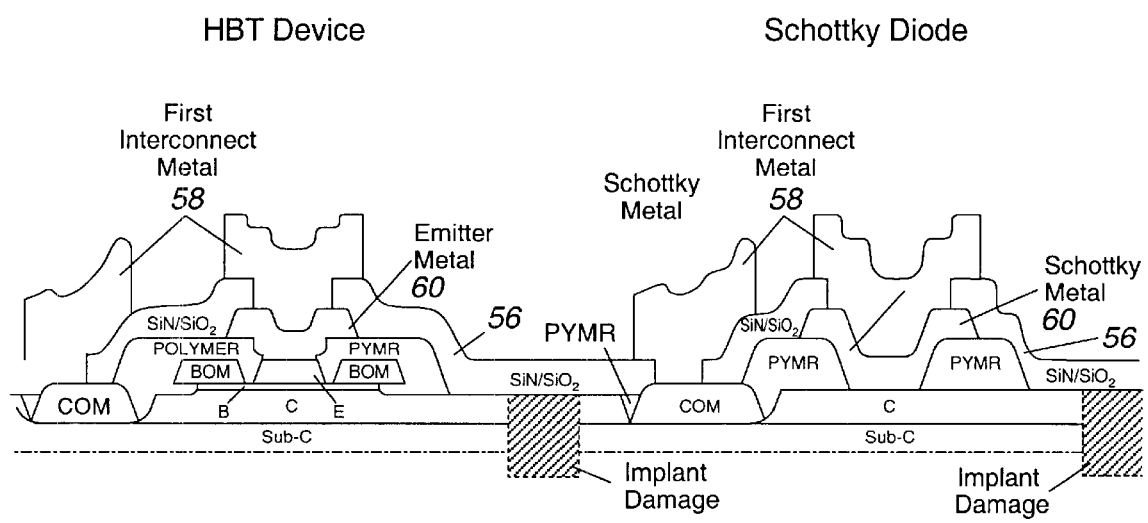

As shown in FIG. 20, the isolation resist 50 is subsequently stripped using standard techniques. Then the wafer processing is completed by conventional process procedures, such as:

i. position of a 1000 Å to 3000 Å SiN (or $SiO_2$) layer 56,
 ii. the formation of one or more types of thin film resistors (not shown),
 iii. patterning and etching vias through the SiN (or $SiO_2$) layer 56 to each of the device metal electrodes,
 iv. and forming a first metal interconnect layer 58 to contact the device metal electrodes.

Additional layers of dielectrics, vias in the dielectrics, and patterned metal films can be added to complete the fabrication of integrated circuits in accordance with conventional techniques.

Figure 21:
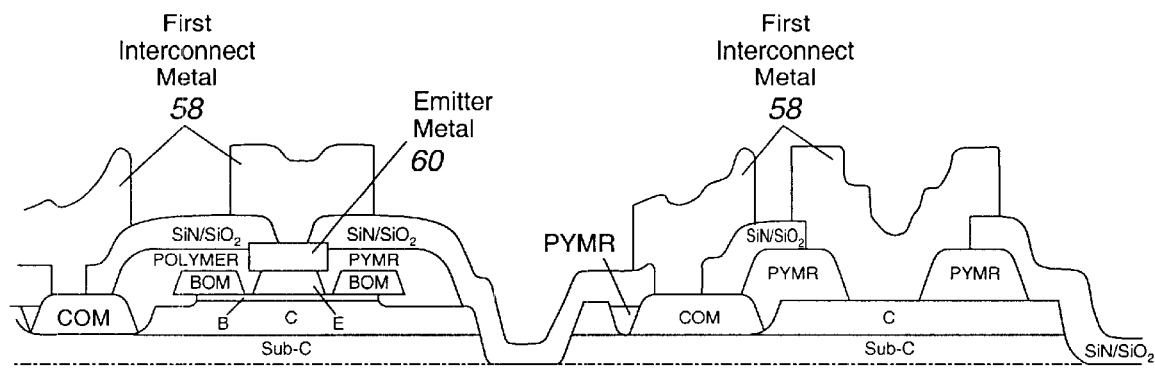

In an alternative process flow, the SiN (or $SiO_2$) layer 22 deposited in FIG. 2 can be-replaced with a metallic film, such as the emitter metal 60 shown in FIG. 21. This metal 60 can be Ti, TiN, W, TiW or similar metal. The metal 60 is patterned in a manner similar to that described previously with regard to the SiN (or $SiO_2$) film 22. For example, an anisotropic dry etch can be used to etch most of the thickness of the metal layer 60, then the etch is completed with an isotropic etch that is selective to the emitter semiconductor layer. The process is continued with the steps shown in FIGS. 3 and 5 through 16, discussed previously. Since the emitter 18 is already contacted with a metal 60 in this alternative process flow, the steps shown in FIG. 17 are not required for making metal contact to the emitter. However, the metal deposition step shown in FIG. 17 can still be used to form the Schottky contact for the Schottky diode 26 if one is being fabricated at the same time as the HBT 10. Alternatively, this metal deposition can be deleted from the process flow, and the first interconnect metal 58 shown in FIG. 20 can be used to form the anode of the Schottky diode 26, provided the bottom layer of the first interconnect metal 26 can be used to form the anode of the Schottky diode 26. In other words, in that case the bottom layer of the first interconnect metal 58 is chosen to form a Schottky barrier contact to the lightly doped collector region. The arrangement of the final HBT 10 and Schottky diode 26 cross sections for this alternative process are shown in FIG. 21. Although the Schottky diode 26 has been described as being adjacent HBT 10, it may also be elsewhere on the same substrate.

Figure 22:
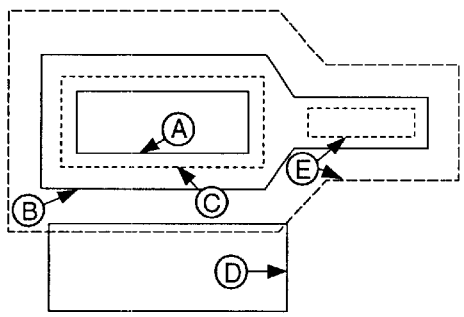
FIGS. 22 to 25 are plan views showing mask layer arrangements for layout of the HBT device with an advantageous base ohmic design.

The process flows described above have a particular advantage when the base ohmic metal region 30 is designed to form a narrow ring around the emitter 18 and the area on the base ohmic metal 30 that is to be contacted by external metal has a narrow width. A sketch diagramming the first five mask layers for the layout of a HBT device 10 with the advantageous base ohmic design is shown in FIG. 22. The emitter layer "A" mask size can have a width of about 0.3 µm to 3 µm or larger with a length of about 0.5 µm to 20 µm or larger. The final emitter size will be somewhat smaller due to the isotropic or partial isotropic etches used in etching the emitter 18. The base ohmic metal layer "B" extends only about 0.3 µm to 0.5 µm past the emitter layer "A," and the area of the base ohmic metal 30 that is to be contacted with external metal is defined at a width of only about 0.4 µm to 1.0 µm. With the emitter area 18 protected by resist defined by rectangle "C" the base ohmic metal 30 can be undercut by about 0.1 µm to 0.2 µm during the etching of the base semiconductor region 16. This reduces the collector-base parasitic device capacitance with little or no increase of the parasitic base resistance. The collector ohmic region "D" can be placed very close to the base ohmic region within about 0.3 µm to 0.5 µm. The planarized polymer layer "E" only has to extend about 0.3 µm past the base ohmic metal 30 to provide for the self-aligned emitter metal region (not shown) with a sloped edge, which provides for metal step coverage over the undercut base ohmic metal 30. Also, a contact hole is provided in the polymer 38 for the base ohmic metal 30. It should be noted the polymer layer 38 can also be defined to extend past the collector ohmic metal "D" with a similar contact hole in the polymer 38 to the collector ohmic metal 36 to ensure the region between the collector ohmic metal 36 and etched semiconductor remains filled with polymer 38.

Figure 23:
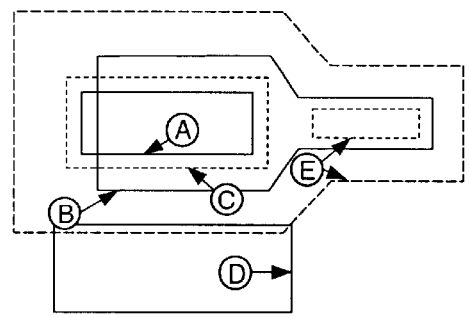
Figure 24:
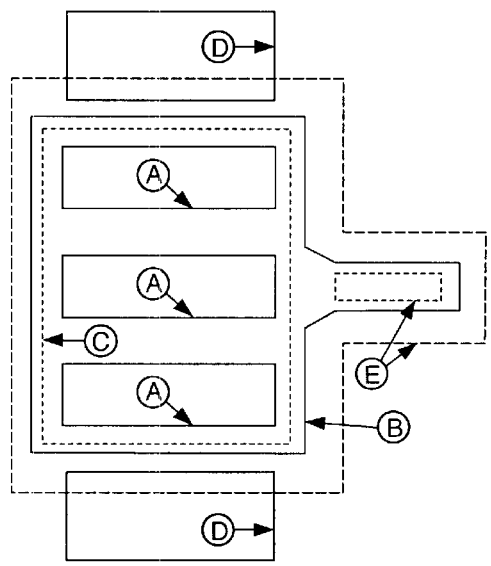
Figure 25:
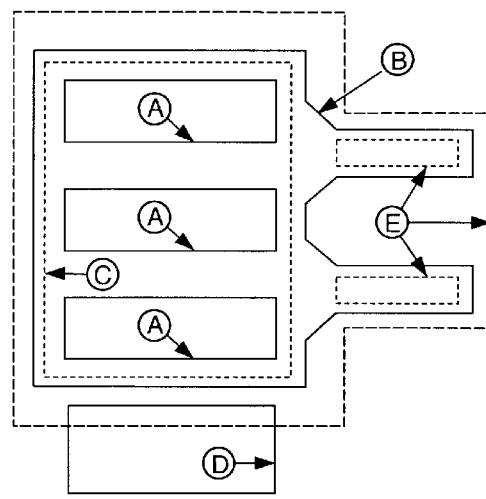

An alternate layout of the HBT device 10 is shown in FIG. 23. In this layout the base ohmic metal "B" extends only partially around the emitter region "A," further reducing the base-collector capacitance at the expense of some increase in the base parasitic resistance. For multiple emitter devices having two or more emitter regions, as shown in FIGS. 24 and 25, the base ohmic metal 30 can be contacted with a single base ohmic region for minimum base-collector capacitance or with 2 or more base ohmic regions for lower base parasitic resistance. HBT devices can also be connected with 2 collector ohmic regions "D" as shown in FIG. 24. Other conventional HBT device layouts can be used with the process flows described above.

While the present invention has been described in detail and pictorially in the accompanying drawings, it is not limited to such details since many changes and modifications recognizable to those of ordinary skill in the art may be made to the invention without departing from the spirit and the scope thereof.

What is claimed is:

1. A method of forming a heterojunction bipolar transistor (HBT) comprising:

a) forming a collector layer, a base layer and an emitter layer in a stacked arrangement on a substrate;
 b) depositing a layer of material on said emitter layer and forming a first photoresist over a portion of said material, etching said layer of material and said emitter layer using said first photoresist as a mask to form an emitter mesa on the base layer with the layer of material on top of said emitter mesa and said first photoresist on top of said layer of material;
 c) depositing a second photoresist on said base layer;
 d) patterning and developing said second photoresist on said base layer to expose a portion of the base layer surrounding the emitter mesa;
 e) depositing a base ohmic metal on said first and second photoresists and the exposed portion of the base layer;
 f) lifting off the first and second photoresists and the base ohmic metal formed over it leaving the base ohmic metal on the base layer, wherein the base ohmic metal is uniformly spaced relative to the emitter mesa;
 g) covering the emitter mesa and a portion of the base ohmic metal with a third photoresist; and
 h) etching the base layer to undercut the base ohmic metal to reduce the size of the base layer.

2. A method according to claim 1, further comprising removing the third photoresist and forming a polymer over the emitter mesa and the base layer, wherein the polymer extends on the base layer under the undercut area of the base ohmic metal.

3. A method according to claim 1, further comprising:

removing the third photoresist;

forming a fourth photoresist over the emitter mesa and the base layer;

patterning the fourth photoresist to expose a portion of the collector layer; and depositing a collector ohmic metal on said exposed portion of the collector layer.

4. A method according to claim 3, further comprising removing the fourth photoresist and forming a polymer over the emitter mesa and the base layer, wherein the polymer extends on the base layer under the undercut area of the base ohmic metal.

5. A method according to claim 1, wherein the material formed on top of the emitter mesa is a sacrificial material.

6. A method according to claim 5, wherein the sacrificial material is a dielectric.

7. A method according to claim 5, further comprising:

removing the sacrificial material; and depositing a layer of metal over the top of the emitter mesa to form an emitter ohmic contact.

8. A method according to claim 1, wherein the material formed on top of the emitter mesa is a metal which forms an emitter ohmic contact for the HBT.

9. A method of forming a device including an HBT and a Schottky diode simultaneously comprising:

a) forming a collector layer, a base layer and an emitter layer in a stacked arrangement on a substrate;

b) depositing a layer of material on said emitter layer and forming a first photoresist over a portion of said material, etching said layer of material and said emitter layer using said first photoresist as a mask to form an emitter mesa on the base layer with the layer of material on top of said emitter mesa and said first photoresist on top of said layer of material;

c) depositing a second photoresist on said base layer;

d) patterning and developing said second photoresist on said base layer to expose a portion of the base layer surrounding the emitter mesa;

e) depositing a base ohmic metal on said first and second photoresists and the exposed portion of the base layer;

f) lifting off the first and second photoresists and the base ohmic metal formed over it leaving the base ohmic metal on the base layer, wherein the base ohmic metal is uniformly spaced relative to the emitter mesa;

g) covering the emitter mesa and a portion of the base ohmic metal with a third photoresist; and h) etching the base layer to undercut the base ohmic metal to reduce the size of the base layer;

i) removing the third photoresist;

j) forming a fourth photoresist over the emitter mesa and the exposed surface of the base layer;

k) patterning the fourth photoresist to expose a portion of the collector layer;

l) depositing a collector ohmic metal on the exposed surface of the collector layer;

m) removing the fourth photoresist;

n) depositing and etching a polymer layer so that polymer covers the emitter mesa, the base ohmic metal, a portion of the collector ohmic metal and a portion of the collector layer excluding at least part of the upper surface of the collector layer;

o) removing the material covering the upper surface of the emitter mesa;

p) depositing a fifth photoresist over the emitter mesa, the exposed surface of the collector layer and over the collector ohmic metal and patterning the fifth photoresist to expose an upper surface of the emitter mesa and a portion of the collector layer where the Schottky diode is to be formed; and q) depositing a metal layer over the exposed upper surface of the emitter mesa and over the exposed portion of the collector layer where the Schottky diode is to be formed, thereby forming an emitter ohmic metal and the anode of the Schottky diode.

10. A method according to claim 9, further comprising:

removing the fifth photoresist;

depositing a sixth photoresist on both the HBT and the Schottky diode and patterning the sixth photoresist to expose a portion of the collector layer around the HBT and the Schottky diode; and forming an isolation region around the HBT and the Schottky diode.

11. A method according to claim 10, wherein the isolation region is a trench.

12. A method according to claim 10, wherein the isolation region is an implant damage region.

13. A method according to claim 9, wherein the material is a dielectric material.

14. A method of forming a device including an HBT and a Schottky diode simultaneously, comprising:

a) forming a collector layer, a base layer and an emitter layer in a stacked arrangement on a substrate;

b) depositing a layer of metal on said emitter layer and forming a first photoresist over a portion of said metal, etching said layer of metal and said emitter layer using said first photoresist to form an emitter mesa on the base layer with the metal on top of said emitter mesa and said the first photoresist on top of said metal;

c) depositing a second photoresist on said base layer;

d) patterning and developing said second photoresist on said base layer to expose a portion of the base layer surrounding the emitter mesa;

e) depositing a base ohmic metal on said first and second photoresists and the exposed portion of the base layer;

f) lifting off the first and second photoresists and the base ohmic metal formed over it leaving the base ohmic metal on the base layer, wherein the base ohmic metal is uniformly spaced relative to the emitter mesa;

g) covering the emitter mesa and a portion of the base ohmic metal with a third photoresist; and h) etching the base layer to undercut the base ohmic metal to reduce the size of the base layer;

i) removing the third photoresist;

j) forming a fourth photoresist over the emitter mesa and the exposed surface of the base layer;

k) patterning the fourth photoresist to expose a portion of the collector layer;

l) depositing a collector ohmic metal on the exposed surface of the collector layer;

m) removing the fourth photoresist;

n) depositing and etching a polymer layer so that polymer covers the emitter mesa, the base ohmic metal, a portion of the collector ohmic metal and a portion of the collector layer excluding at least part of the upper surface of the collector layer;

o) depositing a fifth photoresist over the emitter mesa and the exposed surface of the collector layer and the collector ohmic metal and patterning the fifth photoresist to expose an upper surface of the collector layer where the Schottky diode is to be formed; and p) depositing a metal layer over the exposed upper surface of the collector layer where the Schottky diode is to be formed, thereby forming the anode of the Schottky diode.

15. A method according to claim 14, further comprising:

removing the fifth photoresist;

depositing a sixth photoresist on both the HBT and the Schottky diode and patterning the sixth photoresist to expose a portion of the collector layer around the HBT and the Schottky diode; and forming an isolation region around the HBT and the Schottky diode.

16. A method according to claim 15, wherein the isolation region is a trench.

17. A method according to claim 15, wherein the isolation region is an implant damage region.

18. A method of forming a device including an HBT and a Schottky diode simultaneously comprising:

a) forming a collector layer, a base layer and an emitter layer in a stacked arrangement on a substrate;

b) depositing a layer of material on said emitter layer and forming a first photoresist over a portion of said material, etching said layer of material and said emitter layer using said first photoresist as a mask to form an emitter mesa on the base layer with the layer of material on top of said emitter mesa and said first photoresist on top of said layer of material;

c) depositing a second photoresist on said base layer;

d) patterning and developing said second photoresist on said base layer to expose a portion of the base layer surrounding the emitter mesa;

e) depositing a base ohmic metal on said first and second photoresists and the exposed portion of the base layer;

f) lifting off the first and second photoresists and the base ohmic metal formed over it leaving the base ohmic metal on the base layer, wherein the base ohmic metal is uniformly spaced relative to the emitter mesa;

g) covering the emitter mesa and a portion of the base ohmic metal with a third photoresist; and h) etching the base layer to undercut the base ohmic metal to reduce the size of the base layer;

i) removing the third photoresist;

j) forming a fourth photoresist over the emitter mesa and the exposed surface of the base layer;

k) patterning the fourth photoresist to expose a portion of the collector layer;

l) depositing a collector ohmic metal on the exposed surface of the collector layer;

m) removing the fourth photoresist;

n) depositing a polymer layer over the emitter mesa, the exposed portion of the collector layer and the base ohmic metals, wherein the polymer layer extends on the base layer under the undercut area of the base ohmic metal;

o) etching the polymer layer to expose the upper surface of the material covering the emitter mesa;

p) forming a fifth photoresist over the polymer and the exposed upper surface of the material covering the emitter mesa;

q) patterning the photoresist and etching the polymer so that the polymer covers the emitter mesa and the base ohmic metal while exposing the upper surface of the collector layer and at least a portion of the collector ohmic metal;

r) removing the fifth photoresist and the material covering the upper surface of the emitter mesa;

s) forming a sixth photoresist over the emitter mesa, the exposed surface of the collector layer and the collector ohmic metal and patterning the sixth photoresist to expose an upper surface of the emitter mesa and a portion of the collector layer where the Schottky diode is to be formed; and t) depositing a metal layer over the exposed upper surface of the emitter mesa and over the exposed portion of the collector layer where the Schottky diode is to be formed, thereby forming an emitter ohmic metal and the Schottky diode anode.

19. A method according to claim 18, further comprising:

removing the sixth photoresist;

depositing a seventh photoresist over both the HBT and the Schottky diode and patterning the seventh photoresist to expose a portion of the collector layer between the HBT and the Schottky diode; and forming an isolation region around the HBT and the Schottky diode at the exposed region of the collector layer.

20. A method according to claim 19, wherein the isolation region is a trench.

21. A method according to claim 19, wherein the isolation region is an implant damage region.

22. A method according to claim 18, wherein the material is a dielectric material.

* * * * *